United States Patent
Yim et al.

(10) Patent No.: US 7,107,125 B2
(45) Date of Patent: Sep. 12, 2006

(54) METHOD AND APPARATUS FOR MONITORING THE POSITION OF A SEMICONDUCTOR PROCESSING ROBOT

(75) Inventors: Pyongwon Yim, Sunnyvale, CA (US); Satish Sundar, Milpitas, CA (US); Vinay Shah, San Francisco, CA (US); Mario David Silvetti, Morgan Hill, CA (US); Douglas Kitajima, San Jose, CA (US); Venkatesh Babu, San Jose, CA (US); Visweswaren Sivaramakrishnan, Santa Clara, CA (US); Indrajit Lahiri, Santa Clara, CA (US); Surinder Bedi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 287 days.

(21) Appl. No.: 10/697,731

(22) Filed: Oct. 29, 2003

(65) Prior Publication Data

US 2005/0096794 A1    May 5, 2005

(51) Int. Cl.
 *G05B 15/00*  (2006.01)
 *G05B 19/00*  (2006.01)
(52) U.S. Cl. ..................... 700/258; 700/245
(58) Field of Classification Search ............. 700/258, 700/245
See application file for complete search history.

(56) References Cited

U.S. PATENT DOCUMENTS

| | | | | |
|---|---|---|---|---|
| 4,819,167 A | 4/1989 | Cheng et al. | .......... | 364/167.01 |
| 5,452,521 A | 9/1995 | Niewmierzycki | ............ | 33/520 |
| 5,483,138 A | 1/1996 | Shmookler et al. | .... | 318/568.16 |
| 5,538,385 A * | 7/1996 | Bacchi et al. | ............... | 414/403 |
| 5,844,683 A | 12/1998 | Pavloski et al. | ............ | 356/399 |
| 5,917,601 A | 6/1999 | Shimazaki et al. | ......... | 356/375 |
| 5,980,194 A | 11/1999 | Freerks et al. | .............. | 414/754 |
| 6,002,840 A | 12/1999 | Hofmeister | ................... | 395/80 |
| 6,051,113 A | 4/2000 | Moslehi | ................. | 204/192.12 |
| 6,198,976 B1 | 3/2001 | Sundar et al. | ................ | 700/59 |
| 6,244,121 B1 | 6/2001 | Hunter | ....................... | 73/865.9 |
| 6,275,748 B1 * | 8/2001 | Bacchi et al. | ............... | 700/275 |
| 6,313,596 B1 | 11/2001 | Wyka et al. | ................ | 318/640 |
| 6,366,830 B1 * | 4/2002 | Bacchi et al. | ............... | 700/250 |
| 6,453,214 B1 * | 9/2002 | Bacchi et al. | ............... | 700/245 |
| 6,468,816 B1 | 10/2002 | Hunter | ........................ | 438/14 |
| 6,618,645 B1 * | 9/2003 | Bacchi et al. | ............... | 700/245 |
| 6,648,730 B1 | 11/2003 | Chokshi et al. | ................ | 451/6 |

(Continued)

OTHER PUBLICATIONS

Xu et al., Conceptual design fof an integrated loaser-optical measuring system for flexible manipulator, 1996, IEEE, p. 1247-1252.*

(Continued)

*Primary Examiner*—Thomas G. Black
*Assistant Examiner*—McDieunel Marc
(74) *Attorney, Agent, or Firm*—Patterson and Sheridan

(57) ABSTRACT

A robotic positioning system that cooperates with a sensing system to correct robot motion is provided. The sensing system is decoupled from the sensors used conventionally to control the robot's motion, thereby providing repeatable detection of the robot's true position. In one embodiment, the positioning system includes a robot, a controller, a motor sensor and a decoupled sensor. The robot has at least one motor for manipulating a linkage controlling the displacement of a substrate support coupled thereto. The motor sensor is provides the controller with motor actuation information utilized to move the substrate support. The decoupled sensor provides information indicative of the true position the substrate support that may be utilized to correct the robot's motion.

19 Claims, 6 Drawing Sheets

U.S. PATENT DOCUMENTS

| | | | |
|---|---|---|---|
| 2002/0078770 A1 | 6/2002 | Hunter | 73/865.9 |
| 2002/0092369 A1 | 7/2002 | Hunter | 73/865.9 |
| 2002/0101508 A1 | 8/2002 | Pollack | 348/85 |
| 2003/0001083 A1 | 1/2003 | Corrado et al. | 250/239 |
| 2003/0055533 A1* | 3/2003 | Bacchi et al. | 700/275 |
| 2003/0198376 A1 | 10/2003 | Sadighi et al. | 382/153 |
| 2003/0202092 A1 | 10/2003 | Sadighi et al. | 348/87 |
| 2004/0039486 A1* | 2/2004 | Bacchi et al. | 700/275 |
| 2004/0101633 A1* | 5/2004 | Zheng et al. | 427/551 |
| 2005/0021177 A1* | 1/2005 | Bacchi et al. | 700/245 |
| 2005/0153073 A1* | 7/2005 | Zheng et al. | 427/248.1 |

OTHER PUBLICATIONS

"Wafercam™ System: Wireless Camera System for Semiconductor Processing Robotic Arm Calibration", www.qtweed.com/semiconductor/Wafercam.htm, printed Dec. 10, 2002.

* cited by examiner

METHOD AND APPARATUS FOR MONITORING THE POSITION OF A SEMICONDUCTOR PROCESSING ROBOT

BACKGROUND OF THE INVENTION

1. Field of the Invention

Embodiments of the invention generally relate to robots suitable for use in semiconductor processing systems.

2. Background of the Invention

The modern semiconductor processing system typically includes a central transfer chamber surrounded by a plurality of processing chambers. The central transfer chamber is generally coupled to a factory interface by one or more load lock chambers suitable for transferring the substrate between the vacuum environment of the transfer chamber and the generally atmospheric environment of the factory interface. The factory interface typically contains one or more substrate storage cassettes for staging processed and unprocessed substrates.

Accurate and repeatable substrate transfer using the robots of the semiconductor processing system is essential to ensure the processing results, to reduce damage to substrates and processing equipment, and to enhance repeatability between substrates.

FIG. 7 depict one embodiment of a typical single-blade substrate transfer robot 700 utilized in many semiconductor processing systems. The robot 700 includes a blade 710 for supporting a substrate 712 during transfer. The blade 710 is coupled to a body 704 by a linkage 702. The linkage comprises a first arm 706 and a second arm 708 that are coupled to the body at a first end and coupled to a wrist 714 at a second end. The wrist is coupled to the blade 710. Each arm 706, 708 is coupled to a respective motor (not shown) concentrically stacked within the body 704. The positioning of the blade 710 is determined by the relative angular positioning of the respective arms 706, 708 by the concentrically stacked motors. For example, if the linkages 706, 708 are rotated by the concentrically stacked motors in the same direction about the central axis 720 of the body 704, the blade 710 is rotated about the central axis 720 as shown by the arrow 716. If the first arm and second arm 706, 708 are rotated in opposite directions, the blade 710 is radially extended or retracted, as shown by arrow 718.

However, the ability to accurately position the blade 710 may be compromised by a number of factors. For example, the linkage 702 and/or the blade 710 may become bent during handling or maintenance procedures. Additionally, thermal expansion of the linkage or loosening of the belts commonly used within the linkage may result in positional drift of the blade. Thus, the blade may not arrive in the position expected based on a calculated movement of the arm. As these aforementioned problems undesirably diminish the ability for efficient and repeatable substrate transfer, it would be desirable to improve the positional accuracy of the robot blade.

Therefore, there is a need for a method and apparatus for monitoring the position of a substrate transfer robot.

SUMMARY OF THE INVENTION

A robotic positioning system that cooperates with a sensing system to correct robot motion is provided. The sensing system is decoupled from the sensors used conventionally to control the robot's motion, thereby providing repeatable detection of the robot's true position. In one embodiment, the positioning system includes a robot, a controller, a motor sensor and a decoupled sensor. The robot has at least one motor for manipulating a linkage controlling the displacement of a substrate support coupled thereto. The motor sensor provides the controller with motor actuation information utilized to move the substrate support. The decoupled sensor provides information indicative of the true position of the substrate support that may be utilized to correct the robot's motion.

BRIEF DESCRIPTION OF THE DRAWINGS

So that the manner in which the above-recited features, advantages and objects of the present invention are obtained and can be understood in detail, a more particular description of the invention, briefly summarized above, may be had by reference to the embodiments thereof which are illustrated in the impended drawings. It is to be noted, however, that the appended drawings illustrate only typical embodiments of this invention and are, therefore, not be considered limiting of its scope, for the invention may admit to other equally effective embodiments.

To facilitate understanding, identical reference numerals have been used, where possible, to designate identical elements that are common to the figures.

DETAILED DESCRIPTION

Figure 1:
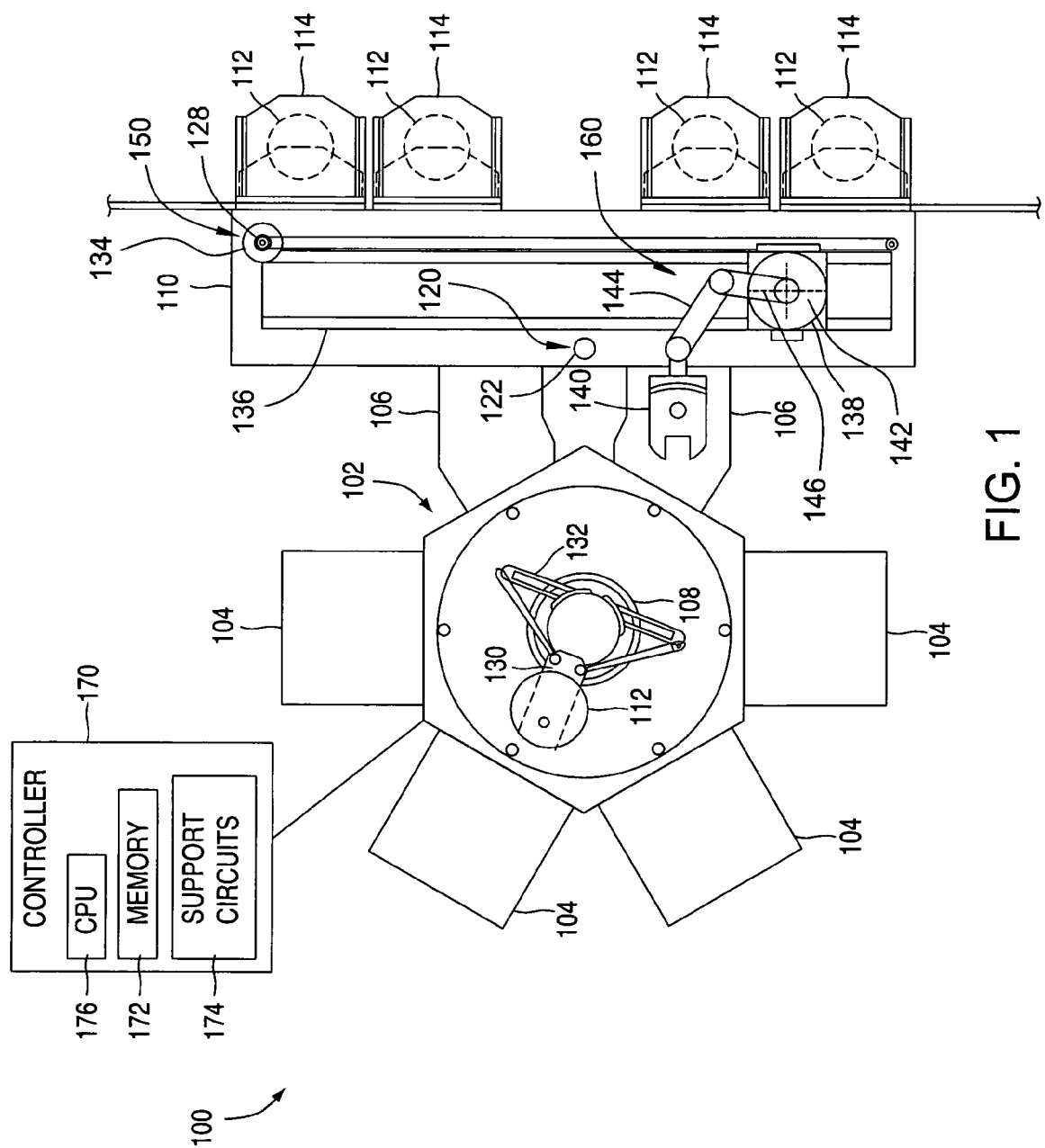
FIG. 1 is a plan view of an exemplary substrate processing system including at least one robot having at least one decoupled robot position sensing system.

FIG. 1 depicts one embodiment of a semiconductor processing system 100 having at least one robotic positioning system 150. The exemplary processing system 100 generally includes a transfer chamber 102 circumscribed by one or more processing chambers 104, a factory interface 110 and one or more load lock chambers 106. The load lock chambers 106 are generally disposed between the transfer chamber 102 and the factory interface 110 to facilitate substrate transfer between a vacuum environment maintained in the transfer chamber 102 and a substantially ambient environment maintained in the factory interface 110.

The transfer chamber 102 defines an evacuable interior volume 116 through which substrates are transferred between the process chambers 104 coupled to the exterior of the transfer chamber 102. The process chambers 104 are typically bolted to the exterior of the transfer chamber 102. Examples of process chambers 104 that may be utilized include etch chambers, physical vapor deposition chambers, chemical vapor deposition chambers, ion implantation chambers, orientation chambers, lithography chambers and the like. Different process chambers 104 may be coupled to the transfer chamber 102 to provide a processing sequence necessary to form a predefined structure or feature upon the substrate surface.

The load lock chambers 106 are generally coupled between the factory interface 110 and the transfer chamber 102. The load lock chambers 106 are generally used to facilitate transfer of the substrates between the vacuum environment of the transfer chamber 102 and the substantially ambient environment of the factory interface 110 without loss of vacuum within the transfer chamber 102. Each load lock chamber 106 is selectively isolated from the transfer chamber 102 and the factory interface 110 through the use of slit valves (not shown).

A controller 170 is coupled to the system 100 to control processing and substrate transfers. The controller 170 includes a central processing unit (CPU) 176, support circuits 174 and memory 172. The CPU 176 may be one of any form of computer processor that can be used in an industrial setting for controlling various chambers and subprocessors. The memory 172 is coupled to the CPU 176. The memory 176, or computer-readable medium, may be one or more of readily available memory such as random access memory (RAM), read only memory (ROM), floppy disk, hard disk, or any other form of digital storage, local or remote. The support circuits 174 are coupled to the CPU 176 for supporting the processor in a conventional manner. These circuits include cache, power supplies, clock circuits, input/output circuitry, subsystems, and the like.

A first transfer robot 160 is disposed in the factory interface 110 and is adapted to transfer substrates 112 between at least one substrate storage cassette 114 coupled to the factory interface 110 and the load lock chambers 106. Each cassette 114 is configured to store a plurality of substrates therein. One example of a factory interface that may be adapted to benefit from the invention is described in U.S. patent application Ser. No. 09/161,970 filed Sep. 28, 1998 by Kroeker, which is hereby incorporated by reference in its entirety.

A second robot 108 is deposed in the transfer chamber 102 and is adapted to transfer substrates 112 between the processing chambers 104 and the load lock chambers 106. The second substrate transfer robot 108 may include one or more blades utilized to support the substrate during transfer. The second robot 108 may have two blades, each coupled to an independently controllable motor (known as a dual blade robot) or have two blades coupled to the second robot 108 through a common linkage. In one embodiment, the transfer second robot 108 has a single blade 130 coupled to the second robot 108 by a (frog-leg) linkage 132.

The first transfer robot 160 may include one or more blades utilized to support the substrate during transfer. The first transfer robot 160 may have two blades, each coupled to an independently controllable motor (known as a dual blade robot) or have two blades coupled to the first robot 160 through a common linkage. In one embodiment, the first robot 160 has a single blade 140 coupled to a body 142 of first robot 160 by an articulated linkage 144. A motor (not shown), housed within the body 142 controls the range of motion of the blade 140 about a central axis 146 of the robot 160.

To increase the range of motion of the first robot 160, the body 142 is coupled to a guide 138 that is selectively positioned along a rail 136 by an actuator 134. The actuator 134 may be any motion device suitable for positioning the first robot 160 along the rail 136, thereby moving the central axis 146 within the factory interface 110 to facilitate access of the blade 140 to substrates within any of the cassettes 114 or load lock chambers 106. The actuator 134 is generally interfaced with an on board sensor 128, for example a rotary encoder, which provides the controller 120 with a derived positional information of the body 142 along the rail 136. The derived position is a position based on an anticipated motion resulting from a predefined actuation. For example, as the body 142 is expected to move a predefined distance per motor revolution, information provided by the sensor 128 may be utilized to determine a change in position of the body 142. Referenced from a calibrated position stored in the memory of the controller 170, the anticipated position of the body 142 may be derived by knowing the motor motion and/or positional information provided by the sensor 128. Alternatively, the may be another sensor for providing information indicative of the linear displacement of the body 142, such as a linear displacement transducer and the like.

At least one of the robots 160, 108 is interfaced with a sensing system 120 to comprise a robotic positioning system 150. The sensing system 120 provides information to monitor and/or correct the position of the robot. Although the robotic positioning system 150 shown to include the first transfer robot 160 disposed in the factory interface 110 of the exemplary processing system 100, the robotic positioning system 150 may be configured to include the second robot 108. It is also contemplated that it is desirable to adapt the robotic positioning system 150 for use with other robots utilized in other processing systems or semiconductor FABs, wherever accurate robot positioning and correction is desirable.

In the embodiment depicted in FIG. 1, the first transfer robot 160 is interfaced with the sensing system 150 such that the positional accuracy of the first transfer robot 160 may be determined and corrected using one or more sensors decoupled from the sensors on board the robot conventionally used to control the robot's motion. The sensing system 150 includes at least one sensor 122 decoupled from the robot 160 and configured to provide a metric indicative of a true position of the robot 160. The true position is a position based on the actual position of the robot 160.

In the embodiment depicted in FIG. 1, the sensing system 150 is configured to provide a metric indicate of the true position of the central axis 136. The sensing system 150 provides the controller 120 with the true position which is compared with the derived position. If the true and derived positioned are equivalent, then the body 142 and central axis 136 of the first robot 160 is accurately positioned. If the true and derived positioned are not in agreement, the controller 120 then resolves a motion correction it the motor instructions such that the corrected derived position returns the body 142 to the true position. In this manner, the central axis 136 of the first robot 160 may be accurately and repeatably positioned. Moreover, the metric provided by the decoupled sensor 122 is transparent to the motion of the first robot 160 during normal operation, the motion of the robot 160 may be monitored and corrected in-situ, without the need to interrupt processing to run calibration procedures.

Figure 2:
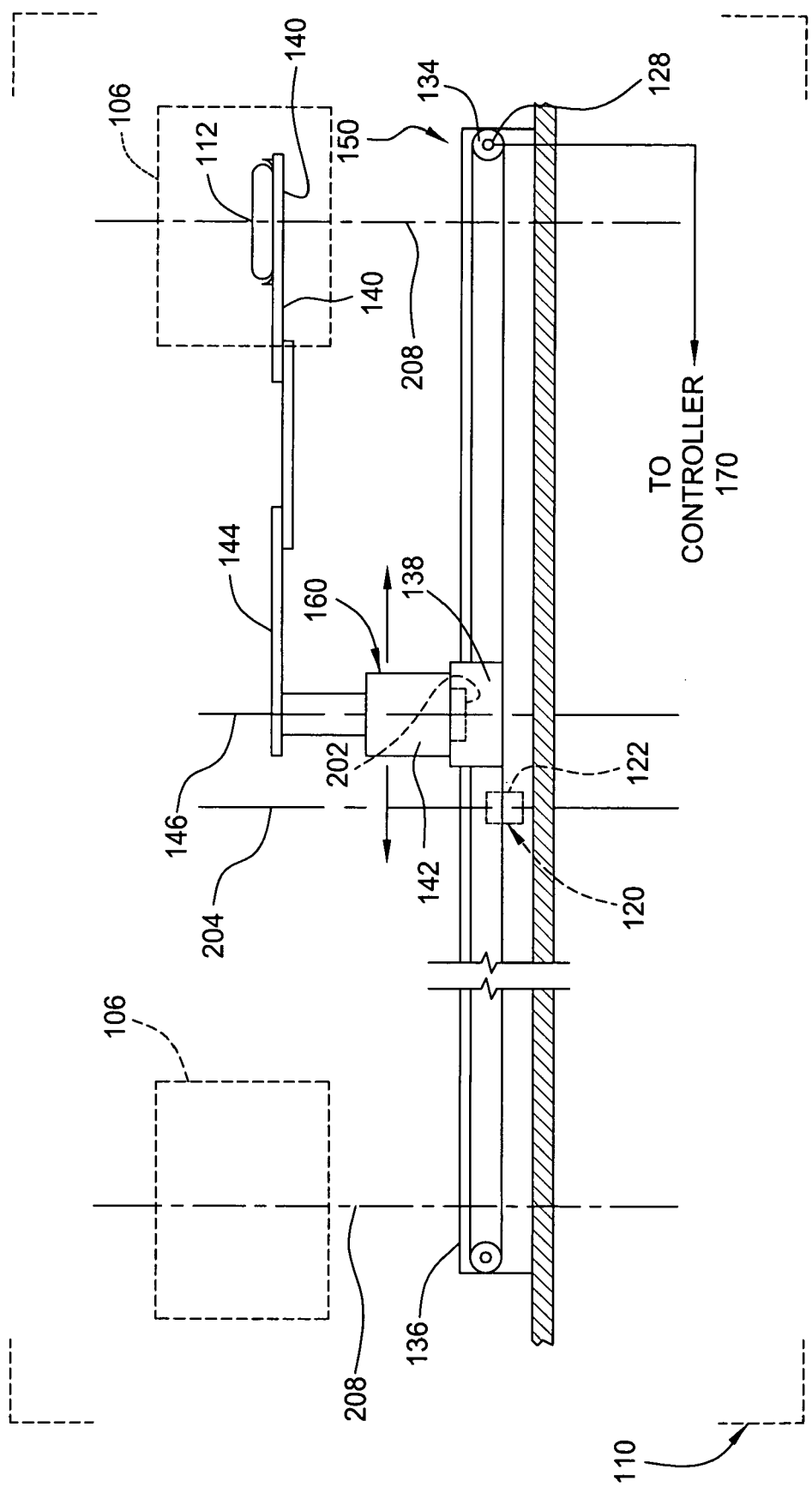
FIG. 2 is a side view of the factory interface illustrating one embodiment of a robotic positioning system that depicts the interface between a substrate transfer robot and a sensing system.

FIG. 2 is a side view of the factory interface 110 illustrating one embodiment of an interface between the first transfer robot 160 and the sensing system 120 comprising the robotic positioning system 150. The sensing system 120 generally includes sensor 122 and a flag 202. The at least one of the sensor 122 or flag 202 is coupled to the factory interface 110 and is fixed relative to the central axis 146 of the first robot 160. In the embodiment depicted in FIG. 2, the sensor 122 is coupled to the factory interface 110 and the flag 202 is coupled to the guide 138 supporting the robot body 142 on the rail 136.

The sensor 122 is fixed in a position where the flag 202, when passing through or within a predefined sensing field of the sensor 122, causes the sensor 122 to change states. The position of the central axis 146 within the factory interface 110 corresponding to where the sensor changes states, known as a calibration position, is indicated by dashed line 204. Other reference positions of the central axis 146 within the factory interface 110 corresponding to where the substrate exchanges (or other process requiring the blade 140 to be in a predefined position) are performed, known as a calculated or taught position, are shown by dashed lines 208. In the embodiment depicted in FIG. 2, the dashed lines 208 indicate the position of the robot's axis 146 where transfers between the first robot 160 and load lock chambers 106 occur. Generally, the first robot 160 is programmed or taught to move to the taught position by instructing the robot to move a predefined distance (or rotation) as resolved by the on-board sensor 128. In other words, movement of the first robot 160 to the taught position is provided by energizing the actuator 134 to move the robot 160 by rotating (in the case of a motorized actuator) a number of rotations corresponding to a desired distance needed to reach the taught position as counted to the on-board sensor 128.

Since the on-board sensor 128 may accumulate positional error over repeated movements or mechanical backlash and play within the motion components, the first robot 160 may not arrive in the taught position as indicated by the dashed lines 208. To correct motion error or robot drift, the sensor 122, which is decoupled from the mechanical linkages of the robot 160 and other sources of drift, provides the controller 170 with a metric indicative of the true position robot 160 at the calibration position which is compared with the metric provided by the on board sensor 128. Differences between the expected position of the first robot 160 derived from the sensor 128 and the reference metrics at the calibrated position are indicative of drift in robot motion, and provide a metric to correct, e.g., recalibrate the robots movement, to that data provided from the on board sensor 128 accurately positions the first robot in the taught positions.

The calibration position may be advantageously positioned between taught positions such that normal robot operations during processing passes the flag through the calibration position. Each time the flag passes through the calibration position, the robot motion may be recalibrated in-situ, thereby continually ensuring accurate robot positioning without need for separate recalibration procedures.

Figure 3:
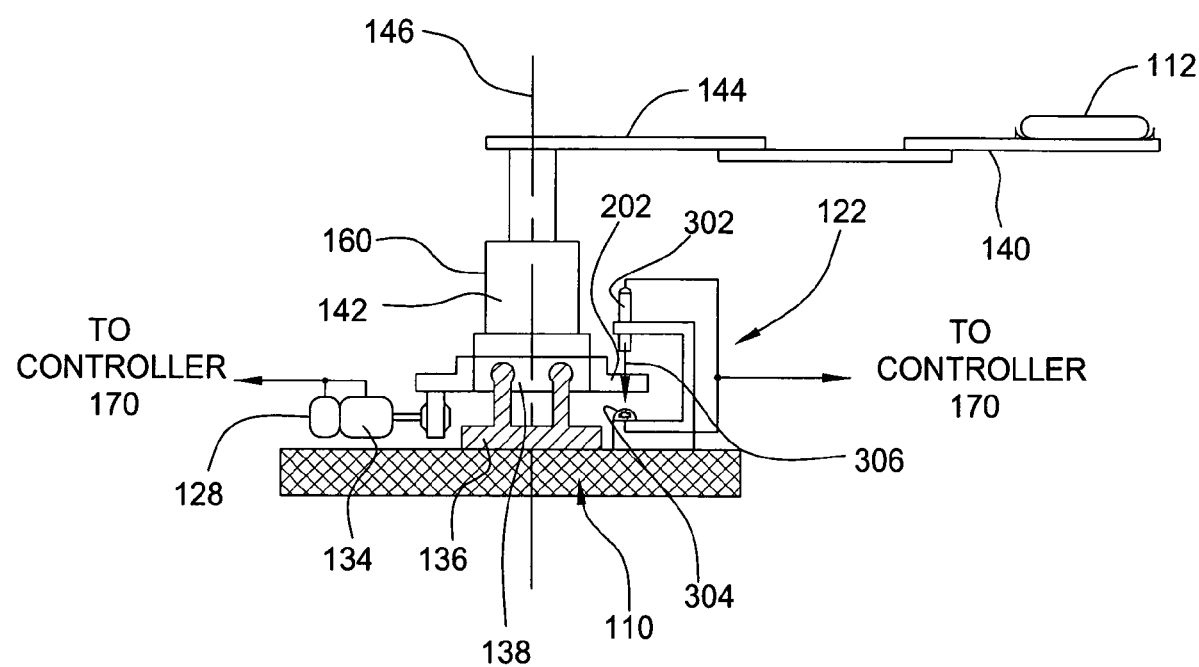
FIG. 3 depicts a sectional view of one embodiment of the sensing system depicted in FIG. 2.

FIG. 3 depicts a sectional view of one embodiment of the sensor 122 and flag 202 of the sensing system 120 depicted in FIG. 2. The sensor 122 is coupled to factory interface 110 and provides the controller 120 with a metric of robot position at each change in sensor state. The sensor 122 may include a separate emitting and receiving unit or may be self-contained such as "thru-beam" and "reflective" sensors. The sensor 122 may be an optical sensor, a proximity sensor, mechanical limit switch, video imaging device, Hall-effect, reed switch or other type of detection mechanism suitable for detecting the presence of the second robot 108 when in a predefined position. It is contemplated that a video imaging device may provide metrics indicative of planar position along with elevation, thereby reducing the number of sensors required in a sensing system. It is also contemplated that the sensor 122, particularly when embodying an optical sensor or video device, may be located outside the factory interface 110 and positioned to view the flag 202, for example, through a window.

In one embodiment, the sensor 122 comprises an optical emitter 302 and receiver 304. One sensor suitable for use is available from Banner Engineering Corporation, located in Minneapolis, Minn. The sensor 122 is positioned such that flag 202, coupled to the second robot 108, guide 138 or other component that moves with the robot central axis 146, interrupts a signal passing between the emitter 302 and receiver 304, such as a beam 306 of light. The interruption and/or return to an uninterrupted state of the beam 306 causes a change in state of the sensor 122. For example, the sensor 116 may have a 4 to 20 ma output, where the sensor 122 outputs a 4 ma in the uninterrupted state while the sensor outputs 20 ma in the interrupted state. Sensors with other outputs may be utilized to signal the change in sensor state.

Figure 4:
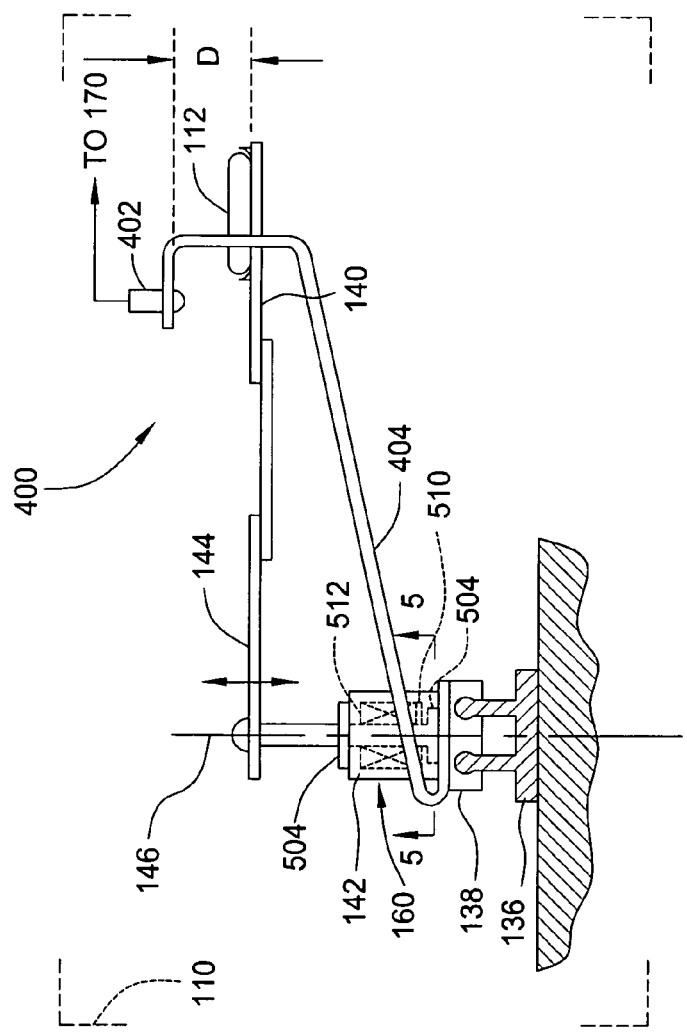
FIG. 4 is a side view of another sensing system.

FIG. 4 depicts another sensing system 400 that may be utilized in place of, or in addition to, the sensing system 120 described above. The sensing system 400 includes one or more sensors 402 disposed in a spaced apart relation to the first robot 160. The one or more sensors 402 may be configured as similar to the sensor 122 described above. The sensors 402 are oriented in a position that is fixed relative to the body 142 of the first robot 160. The sensors 402 are additionally positioned such that the blade 140 of the first robot 160 causes one or more of the sensors 402 to change state when moving between the interior of the factory interface 110 and at least one of the load lock chambers 106 or cassettes 114 (as seen in FIG. 1).

In one embodiment, a bracket 404 is coupled to at least one of the guide 138 or robot body 142. The bracket 404 provides a mounting surface for the sensors 402. It is also contemplated that the bracket 404 be coupled to the robot 160 in a manner that allows the bracket 404 to rotate about the central axis 146 such that the sensors 402 are maintained in radial alignment with the blade 140, thereby allowing positional metrics to be obtained with one sensor or group of sensors during the actuation of the blade 140.

Figure 5:
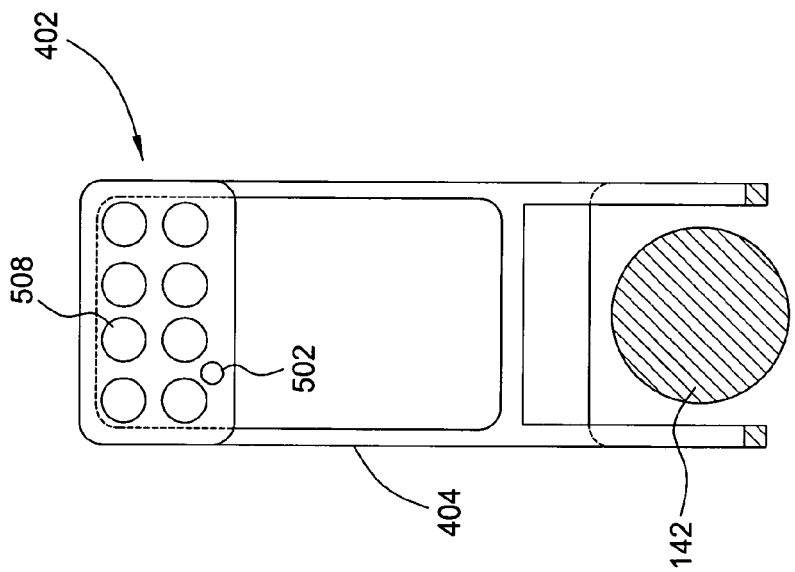
FIG. 5 is a bottom view of one embodiment of a bracket of the sensing system of FIG. 4.

Referring additionally to a bottom view of a portion of the bracket 404 depicted in FIG. 5, the bracket 404 supports a first and at least a second decoupled sensors 502, 508 of the plurality of sensors 402. The first decoupled sensor 502 is configured to provide a metric indicative of the relative distance between the blade 140 and the bracket 404 (shown by "D" in FIG. 4). The metric provided to the controller 170 may compared to a metric of blade elevation provided by an on board sensor 504 that provides feedback from the motion of an actuator 506 of the first robot 160 controlling the elevation of the blade 140. In one embodiment, the on board sensor 504 is a linear displacement transducer or other sensor suitable to determine the change in elevation of the blade 140 as moved by the actuator 506. In this manner, drift or differences between the expected position of the blade 140 (i.e., the position based on blade actuator motion as monitored by the on board sensor 504) may be corrected using the actual position information provided by the decoupled sensor 502.

In the embodiment depicted in FIG. 5, the bracket 404 additionally supports at least a second decoupled sensor 508 of the plurality of sensors 402 which is configured to provide a metric indicative of the relative distance and/or angular orientation of the blade 140 to the central axis 146 of the first robot 160. The metric provided to the controller 170 may compared to a metric of blade position provided by an on-board sensor 510 that provides feedback from the motion of a motor(s) 512 controlling the rotation and/or extension of the blade 140. In the manner, drift or differences between the expected position of the blade 140 (i.e., the position based on robot motor motion as monitored by the on board sensor 510) may be corrected using the actual position information provided by the decoupled sensor 508.

Figure 6:
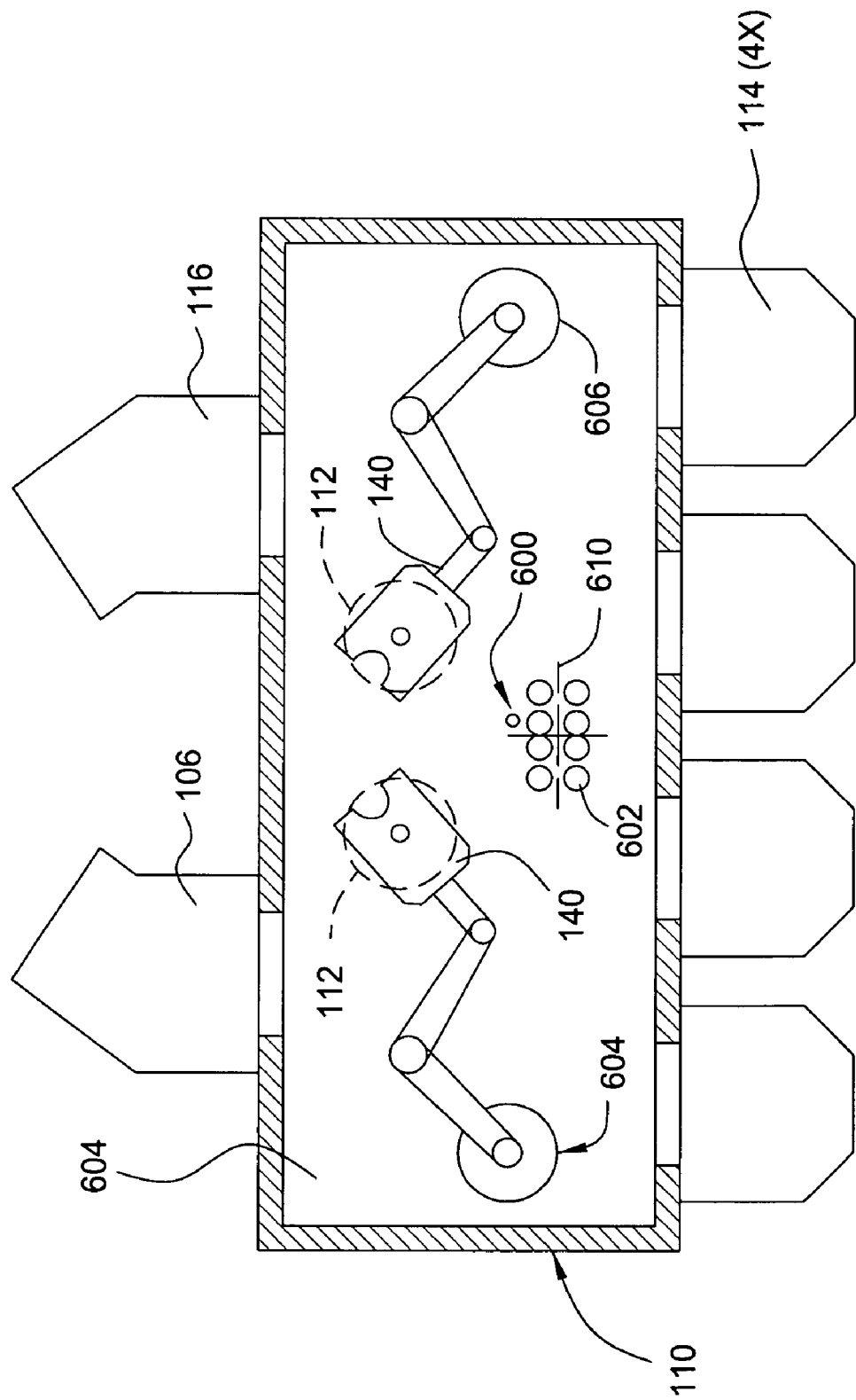
FIG. 6 is a bottom view of another embodiment of a sensing system having sensors mounted to a ceiling of a factory interface.
Figure 7:
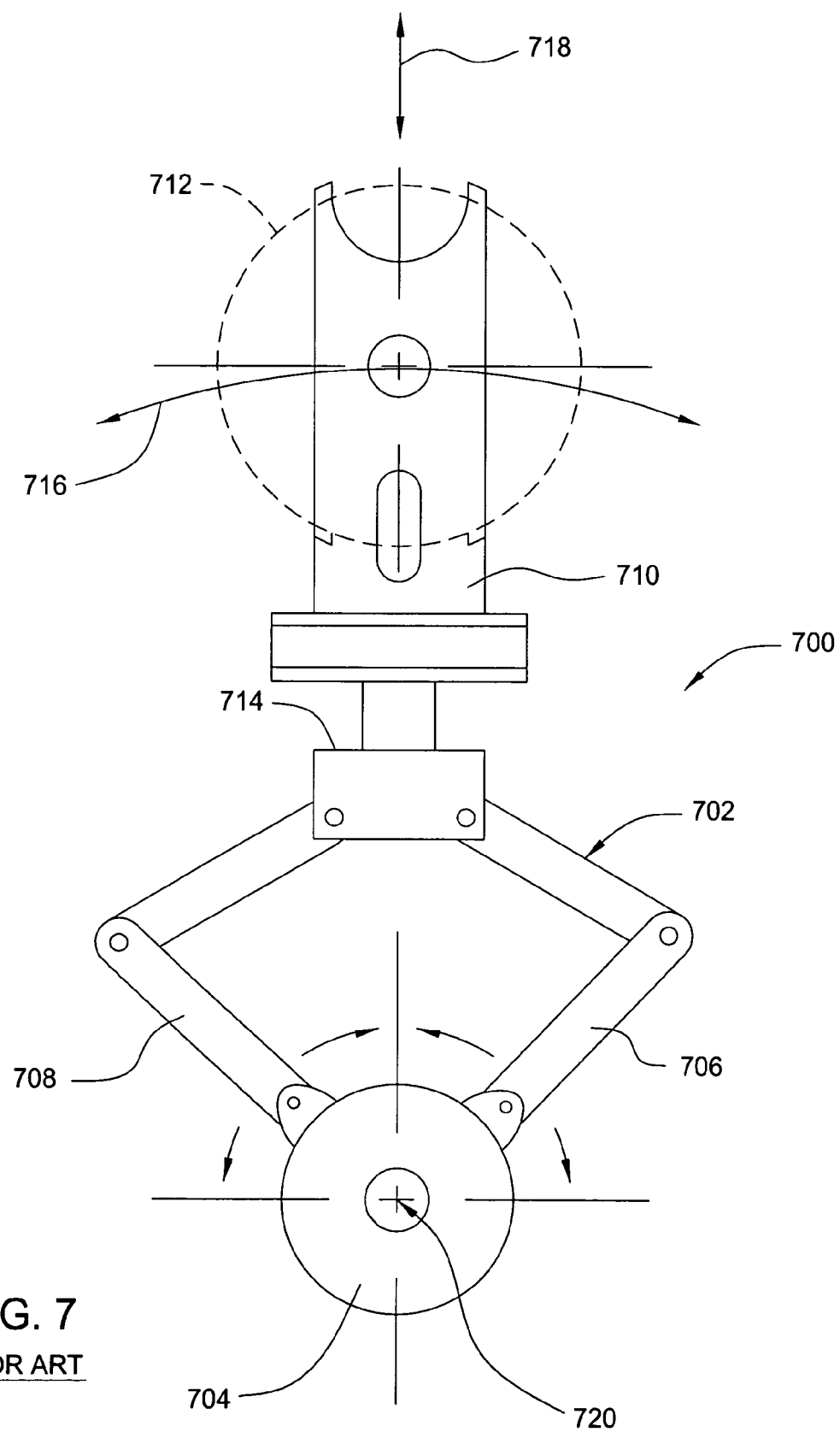
FIG. 7 (prior art) is a plan view of an exemplary substrate transfer robot suitable of a conventional substrate transfer robot suitable for use in a semiconductor processing system.

FIG. 6 is a bottom view of a sensing system 600 having sensors 602 mounted to a ceiling 604 of a factory interface 110. The sensors 602 are generally configured similar to the sensors 402 described above, and are positioned between a first factory interface robot 604 and a second factory interface robot 606. The robots 604, 606, configured similar to the robot 160 described above, may be programmed to pass there respective blades 140 through a calibration position (shown by the center line 610) below the sensors 602 to obtain true positional metrics that may be utilized to correct the robots motion as described above.

Thus, a sensing system has been provided that cooperates with a robotic positioning system to correct robot motion. The sensing system is decoupled from the sensors used conventionally to control the robot's motion, thereby providing repeatable detection of the robot's true position. The true position may be compared to an expected position to correct for drift and misalignment. Moreover, the sensing system may be advantageously configured to allow for in-situ data acquisition and motion correction, thereby eliminating the need for separate recalibration procedures.

While the foregoing is directed to the illustrative embodiment of the present invention, other and further embodiments of the invention may be devised without departing from the basic scope thereof, and the scope thereof is determined by the claims that follow.

What is claimed is:

1. A robotic system comprising:
   a robot having at least one motor for manipulating a linkage controlling the displacement of a substrate support coupled thereto;
   at least one sensor onboard the robot for providing substrate support displacement information utilized to position the substrate support; and
   at least one sensor decoupled from the robot for providing substrate support displacement information for correcting the position of the substrate support.

2. The robotic system of claim 1, wherein the decoupled sensor is positioned to detect presence of the substrate support in a predetermined position, wherein the predetermined position is different than a taught position.

3. The robotic system of claim 1, wherein the decoupled sensor is positioned to detect the rotational orientation of the substrate support.

4. The robotic system of claim 1, wherein the decoupled sensor is positioned to detect the elevation of the substrate support.

5. The robotic system of claim 1, wherein the decoupled sensor is positioned to detect the extension of the substrate support.

6. The robotic system of claim 1, wherein the decoupled sensor is adapted to detect the lateral movement of a central axis of the robot about which the substrate support is rotated.

7. The robotic system of claim 6 further comprising:
   a flag fixed in orientation relative to the central axis of the robot and orientated in a position that causes a change in state of the decoupled sensor when the central axis of the robot is moved through a pre-defined position.

8. The robotic sensing system of claim 7, wherein the decoupled sensor is an optical sensor.

9. The robotic system of claim 8, wherein the decoupled sensor comprises:
   an admitter and receiver disposed in a spaced-apart relation; and
   wherein the flag is coupled to the robot in a position where it may be moved between the admitter and receiver when the robot is in the predefined position.

10. The robotic system of claim 9, wherein the decoupled sensor is selected from the group of sensors consisting of an optical sensor, a capacitor sensor, a Hall effect sensor, an inductive sensor, a mechanical limit switch, an image capturing device and a magnetic sensor.

11. The robotic system of claim 1 further comprising:
    a bracket coupled to the robot and having a sensor mounting portion disposed in a spaced-apart relation relative to the central axis of the robot.

12. The robotic system of claim 1, wherein the decoupled sensor is positioned to detect at least one positional attribute of the substrate support selected from the group consisting of elevation, extension or angular position of the substrate support.

13. The robot system of claim 1, wherein the decoupled sensor is fixed in the factory interface in a spaced-apart relation relative to the robot, and wherein the decoupled sensor further comprises a bank of sensors configured to detect at least one positional attribute of the substrate support selected from the group consisting of elevation, extension or angular position of the substrate support, and wherein the position is different than a taught position of the robot.

14. The robotic system of claim 1, wherein the decoupled sensor is positioned to detect presence of the substrate support in a predetermined position, wherein the predetermined position is disposed between a first taught position and a second taught position.

15. The robotic system of claim 1 further comprising:
    a second robot having a substrate support coupled thereto by a linkage, wherein the decoupled sensor is position to detect the presence of one of the substrate supports at a predefined position, and that the predefined position is within the range of substrate support motion of each robot.

16. The method of claim 1, wherein the decoupled sensor is stationary relative to the substrate support.

17. The method of claim 1, wherein the decoupled sensor is stationary relative to the robot.

18. The method of claim 1, wherein the decoupled sensor is coupled to a factory interface.

19. A robotic system comprising:
    a robot having at least one motor for manipulating a linkage controlling the displacement of a substrate support coupled thereto;
    at least one sensor onboard the robot for providing substrate support displacement information; wherein the robot has at least a bracket adapted to receive the sensor having a sensor mounting portion disposed in a spaced-apart relation relative to the central axis of the robot; and
    at least one sensor decoupled from the robot for providing substrate support displacement information for correcting the position of the substrate support, wherein the decoupled sensor is positioned to detect at least one positional attribute of the substrate support selected from the group consisting of elevation, extension, or angular position of the substrate support.

* * * * *

UNITED STATES PATENT AND TRADEMARK OFFICE
CERTIFICATE OF CORRECTION

PATENT NO. : 7,107,125 B2 Page 1 of 1
APPLICATION NO. : 10/697731
DATED : September 12, 2006
INVENTOR(S) : Yim et al.

It is certified that error appears in the above-identified patent and that said Letters Patent is hereby corrected as shown below:

On the Title page, in item (56), under "U.S. Patent Documents", in column 2, line 10, after "6,366,830" delete "B1" and insert -- B2 --, therefor.

On the Title page, in item (56), under "U.S. Patent Documents", in column 2, line 12, after "6,468,816" delete "B1" and insert -- B2 --, therefor.

On the Title page, in item (56), under "U.S. Patent Documents", in column 2, line 13, after "6,618,645" delete "B1" and insert -- B2 --, therefor.

On the Title page, in item (56), under "U.S. Patent Documents", in column 2, line 13, delete "700/245" and insert -- 700/254 --, therefor.

On the Title page, in item (56), under "Other Publications", in column 2, line 1, delete "fof" and insert -- for --, therefor.

On the Title page, in item (56), under "Other Publications", in column 2, line 1, delete "loaser-optical" and insert -- laser-optical --, therefor.

On page 2, in item (56), under "Other Publications", in column 2, line 2, delete "www.qtweed.com" and insert -- www.gtweed.com --, therefor.

Signed and Sealed this

Nineteenth Day of December, 2006

JON W. DUDAS
*Director of the United States Patent and Trademark Office*